United States Patent
McKnight et al.

(10) Patent No.: US 9,570,488 B2
(45) Date of Patent: Feb. 14, 2017

(54) IMAGE SENSOR BENDING BY INDUCED SUBSTRATE SWELLING

(71) Applicant: Microsoft Technology Licensing, LLC, Redmond, WA (US)

(72) Inventors: Geoffrey P. McKnight, Los Angeles, CA (US); John J. Vajo, Los Angeles, CA (US); Jason A. Graetz, Calabasas, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 14/491,903

(22) Filed: Sep. 19, 2014

(65) Prior Publication Data

US 2016/0086987 A1 Mar. 24, 2016

(51) Int. Cl.
*H01L 31/0232* (2014.01)
*H01L 33/00* (2010.01)
*H01L 29/84* (2006.01)
*H01L 31/00* (2006.01)
*H01L 27/146* (2006.01)

(52) U.S. Cl.
CPC ... *H01L 27/14607* (2013.01); *H01L 27/14601* (2013.01); *H01L 27/14627* (2013.01); *H01L 27/14629* (2013.01); *H01L 27/14683* (2013.01); *H01L 27/14687* (2013.01); *H01L 27/14698* (2013.01)

(58) Field of Classification Search
CPC .................. H01L 27/14607; H01L 27/14627; H01L 27/14601; H01L 27/14629; H01L 27/14683; H01L 27/14687; H01L 27/14698

USPC .... 257/432, 415, 459, 737, 431, 94; 438/98, 438/73, 57

See application file for complete search history.

(56) References Cited

U.S. PATENT DOCUMENTS

| | | | |
|---|---|---|---|
| 5,514,888 A | 5/1996 | Sano et al. | |
| 6,255,025 B1 * | 7/2001 | Akutsu et al. | 430/7 |
| 6,312,959 B1 | 11/2001 | Datskos | |
| 6,451,670 B1 | 9/2002 | Takisawa et al. | |
| 6,706,448 B1 * | 3/2004 | Gole et al. | 429/231.95 |
| 6,791,072 B1 | 9/2004 | Prabhu | |

(Continued)

FOREIGN PATENT DOCUMENTS

| | | |
|---|---|---|
| EP | 2458638 A1 | 5/2012 |
| JP | 2012182194 A | 9/2012 |

OTHER PUBLICATIONS

Clarke, Peter "Sony Curves Images Sensors & TSMC Stacks Them", retrieved on Jul. 30, 2014, available at <<http://www.eetimes.com/document.asp?doc_id=1321841>>, EE Times, Apr. 9, 2014, 2 pages.

(Continued)

*Primary Examiner* — Dzung Tran
(74) *Attorney, Agent, or Firm* — Stephen A. Wight; Sandy Swain; Micky Minhas

(57) ABSTRACT

In some examples, techniques and architectures for fabricating an image sensor chip having a curved surface include placing a substrate on a first surface of an image sensor chip, wherein the first surface of the image sensor chip is opposite a second surface of the image sensor chip, and wherein the second surface of the image sensor chip includes light sensors to generate electrical signals in response to receiving light. Fabricating also includes modifying a volume of the substrate so as to impart forces on the image sensor chip to produce a curved image sensor chip.

14 Claims, 5 Drawing Sheets

(56) References Cited

U.S. PATENT DOCUMENTS

| | | | |
|---|---|---|---|
| 7,190,039 | B2 | 3/2007 | Boettiger et al. |
| 7,397,066 | B2 | 7/2008 | Oliver |
| 7,507,944 | B1 | 3/2009 | Arnzen et al. |
| 7,626,621 | B2 | 12/2009 | Ito et al. |
| 7,696,588 | B2 | 4/2010 | Boettiger et al. |
| 7,714,437 | B2 | 5/2010 | Naya |
| 7,733,397 | B2 | 6/2010 | Lu et al. |
| 7,742,090 | B2 | 6/2010 | Street et al. |
| 7,923,793 | B2 | 4/2011 | Choi et al. |
| 8,124,519 | B2 | 2/2012 | Bone |
| 8,248,499 | B2 | 8/2012 | Sutton et al. |
| 8,836,805 | B2 | 9/2014 | Sutton et al. |
| 8,878,116 | B2 | 11/2014 | Itonaga |
| 2003/0013280 | A1* | 1/2003 | Yamanaka .................... 438/487 |
| 2004/0133275 | A1* | 7/2004 | Mansmann ................. 623/14.12 |
| 2004/0229071 | A1* | 11/2004 | Jankosky et al. ............. 428/621 |
| 2005/0030408 | A1* | 2/2005 | Ito et al. ........................ 348/340 |
| 2005/0035514 | A1 | 2/2005 | Hillman et al. |
| 2006/0186492 | A1 | 8/2006 | Boettiger et al. |
| 2007/0096235 | A1* | 5/2007 | Boettiger et al. ............. 257/434 |
| 2007/0222013 | A1 | 9/2007 | Lincoln et al. |
| 2008/0237443 | A1 | 10/2008 | Oliver et al. |
| 2009/0045510 | A1 | 2/2009 | Naya |
| 2009/0115875 | A1 | 5/2009 | Choi et al. |
| 2009/0184954 | A1 | 7/2009 | Street |
| 2010/0025789 | A1 | 2/2010 | Imai et al. |
| 2011/0057284 | A1 | 3/2011 | Brodie |
| 2011/0163466 | A1 | 7/2011 | Taguchi et al. |
| 2011/0200883 | A1* | 8/2011 | Cui et al. ................... 429/231.4 |
| 2012/0002087 | A1 | 1/2012 | Kim |
| 2012/0147207 | A1 | 6/2012 | Itonaga |
| 2012/0217606 | A1 | 8/2012 | Itonaga |
| 2012/0261551 | A1 | 10/2012 | Rogers |
| 2012/0299140 | A1 | 11/2012 | Sekine |
| 2013/0268490 | A1 | 10/2013 | Keebler et al. |
| 2013/0270662 | A1 | 10/2013 | Roy et al. |
| 2013/0312541 | A1 | 11/2013 | Majidi et al. |
| 2014/0004644 | A1 | 1/2014 | Roy et al. |
| 2014/0049683 | A1 | 2/2014 | Guenter et al. |
| 2016/0086994 | A1 | 3/2016 | Guenter |

OTHER PUBLICATIONS

Guvendiren et al., "Swelling-Induced Surface Patterns in Hydrogels with Gradient Crosslinking Density", In the Journal of Advanced Functional Materials, vol. 19, Iss. 19, Oct. 9, 2009, 9 pages.

Mokwa et al., "CMOS Transistors under Uniaxial Stress on Ultra-Thin Chips for Appications in Bendable Image Sensors", In the Proceedings of the 2012 8th Conference on Ph.D. Research in Microelectronics and Electronics (PRIME), Jun. 12, 2012, 4 pages.

Shao et al., "Synthesis Surface Effects on the Stress and Deformation of Film/Substrate System", In the Journal of Applied Surface Science, vol. 257, Iss. 23, Sep. 15, 2011, 6 pages.

Cherng et al., "Fabrication of polydimethylsiloxane microlens array on spherical surface using multi-replication process", in the Journal of Micromechanics and Microengineering, vol. 24, No. 1 2014, 10 pages.

PCT Search Report & Written Opinion for Application No. PCT/US2015/049276, mailed on Dec. 10, 2015, 13 pages.

Itonaga, "A Novel Curved CMOS Image Sensor Integrated with Imaging System", in the Proceedings of the Symposium on VLSI Technology (VLSI-Technology): Digest of Technical Papers, Jun. 19, 2014, 2 pages.

Iwert et al., "First results from a novel curving process for large area scientific imagers", In the Journal of International Society of Optics and Photonics, SPIE Astronomical Telescopes+, 2012, 14 pages.

International Search Report & Written Opinion Received for PCT Application No. PCT/US2015/049277, Mailed Date: Nov. 26, 2015, 10 Pages.

"Sony Unveils Curved Sensor-Technology" retrieved on Jan. 23, 2015 at <<http://petapixel.com/2014/04/02/sony-unveils-curved-senor-technology/>>, 8 pages.

Tekaya et al, "Mechanical Behavior of Flexible Silicon Devices Curved in Spherical Configurations", in the Proceedings of the 14th International Conference on Thermal, Mechanical and Multi-Physics Simulation and Experiments in Microelectronics and Microsystems, Apr. 14, 2013, 7 pages.

Office action for U.S. Appl. No. 14/677,622, mailed on Jun. 2, 2016, Keefe et al., "Bending Semiconductor Chip in Molds Having Radially Varying Curvature", 8 pages.

Office Action for U.S. Appl. No. 14/677,697, mailed on Jun. 30, 2016, Keefe et al., "Free-Edge Semiconductor Chip Bending", 9 pages.

PCT Search Report and Written Opinion mailed Jul. 1, 2016 for PCT Application No. PCT/US16/025453, 10 Pages.

The PCT Search Report and Written Opinion mailed Jul. 4, 2016 for PCT applicatoin No. PCT/US2016/025454, 11 pages.

The PCT Written Opinion of the International Preliminary Examining Authority mailed Aug. 4, 2016 for PCT application No. PCT/US2015/049276, 7 pages.

\* cited by examiner

US 9,570,488 B2

IMAGE SENSOR BENDING BY INDUCED SUBSTRATE SWELLING

BACKGROUND

Optical systems are commonly used in many devices, such as cameras, telescopes, binoculars, office equipment, and scientific instruments, just to name a few examples. Optical systems may comprise lenses, mirrors, and/or one or more light sensing devices. Performance of optical systems hinges, in part, on the design of each of the elements of the system as well as the overall design of the system, which sets forth the optical interaction among the elements. For example, light output of one lens may be the light input of a subsequent lens or a light sensing device.

Light sensing devices, such as CMOS, charge-coupled devices (CCDs), or photodiodes, are present in a variety of optical systems. Often, CMOS or CCDs are configured in an array fabricated on a silicon substrate. A portion of an optical system that provides light to a CMOS or CCD array may be designed based, at least in part, on particular details of the array, such as the size of the array, the resolution of the array, and the positioning of the array with respect to the remainder of the optical system.

SUMMARY

This disclosure describes techniques and architectures for bending and shaping image sensors. In particular, an image sensor fabricated from a flat, relatively brittle materials, such as silicon or germanium, for example, may be shaped after the image sensor is fabricated, so that the light-sensitive surface of the image sensor is curved to have a spherical, aspheric, or other shape.

To form a curved image sensor, a substrate may be coupled (e.g., bonded, adhered, deposited, or attached) to the backside of the image sensor. The substrate may then be subjected to any number of chemical or physical reactions that increase the volume of the substrate. The increasing volume produces bending forces on the image sensor due to strain gradients between the substrate and the image sensor.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. The term "techniques," for instance, may refer to fabricating equipment, control system(s), method(s), computer-readable instructions, module(s), algorithms, or hardware logic (e.g., Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs)), which may be used to perform the technique(s) as permitted by the context above and throughout the document.

BRIEF DESCRIPTION OF THE DRAWINGS

The detailed description is set forth with reference to the accompanying figures. In the figures, the left-most digit of a reference number identifies the figure in which the reference number first appears. The use of the same reference numbers in different figures indicates similar or identical items or features.

DETAILED DESCRIPTION

Overview

Figure 1:
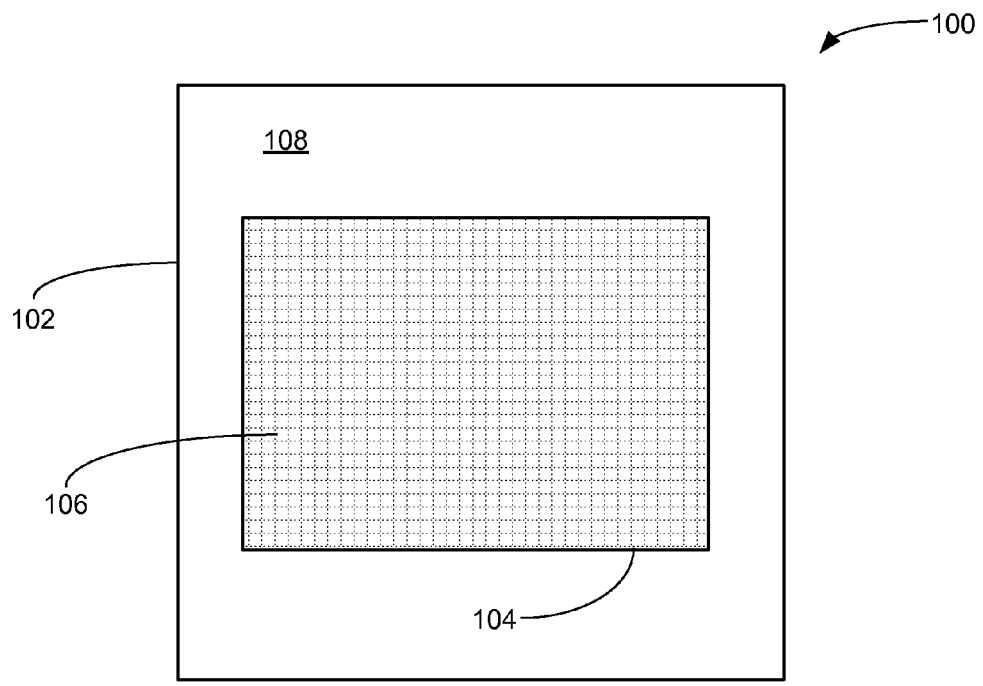
FIG. 1 is a top view of an image sensor chip, according to various example embodiments.

Generally, optical systems may comprise lenses, mirrors, and/or one or more light sensing devices, such as charge-coupled device (CCDs) or other devices that can convert light energy into electrical signals. A plurality of CCDs may be configured in an array (e.g. a pixelated array) fabricated on a substrate, which may be silicon, germanium, or other semiconductor material, for example. A light-sensitive device, such as a CCD, an array of CCDs, or one or more other light sensing entities in any number of configurations, fabricated on a substrate is herein called an "image sensor chip". It should be noted, however, that this name may refer to a light sensor that need not be configured to sense an image, but rather any light signal (visible or not).

An image sensor chip may be bent so that the light-sensitive surface of the image sensor chip has a curved shape, which may provide a number of advantages to the design of an optical system, as compared to a flat-surface image sensor chip. In particular, optical systems comprising lenses and/or mirrors have fewer design constraints when the optical systems include a curved image sensor chip, as compared to a flat-surface image sensor chip. For example, some design constraints may include number of lenses, acceptable tolerances for chromatic and/or spatial aberrations, and so on. An image sensor chip having a spherical, aspheric, or other surface may lead to a high performance optical system that produces a relatively uniform light intensity and spatial frequency response across the surface of the image sensor chip.

In various example embodiments, an image sensor chip may be bent in a process that includes bonding (e.g., fusing, welding, etc.), adhering (e.g., with an adhesive or electrostatic forces), depositing (e.g., by sputtering, pouring, spraying, etc.), or attaching a "volume-changing substrate" onto the image sensor chip. Chemical or physical reactions may be used to change the volume and dimensions of the volume-changing substrate. Volumetric swelling of the volume-changing substrate may generate forces that transfer to the image sensor chip. Such forces may bend or shape the image sensor chip into curved shapes. In various example embodiments, forces generated by the changing volume and dimensions of the volume-changing substrate may be transferred from the volume-changing substrate to the image sensor chip via an interface layer used to couple the volume-changing substrate and the image sensor chip together.

A volume-changing substrate may deform or bend an image sensor chip by tension. Because the image sensor chip may have a lower dark current when in tension, as compared to being in a compressed state, bending the image sensor chip using tension may be beneficial. Accordingly, the volume-changing substrate may be designed so that a substantial portion of the area of the image sensor chip is in tension while being bent or deformed into a desired shape. Such a design may be based, at least in part, on stiffness and/or thickness of the volume-changing substrate so as to place the image sensor chip on the tension side of a neutral bending axis.

Particular shaping of an image sensor chip by volumetric swelling may be controlled by adjusting or selecting any of a number of parameters involved in the volumetric swelling process. For example, particular shapes that a volume-changing substrate will swell into may depend, at least in part, on patterning or distribution of thickness of the volume-changing substrate (and/or an interface layer, if present), stiffness of the image sensor chip, portions of the volume-changing substrate that are exposed to swellants as compared to portions of the volume-changing substrate that are not exposed to the swellants (e.g., by masking or localized application of swellant), and so on.

In some embodiments, a bias pressure may be applied across at least portions of an image sensor assembly during swelling of a substrate to enforce particular 2D curvature shapes. For example, a mold may be placed on a portion of the image sensor during substrate swelling.

Two dimensional curvatures may occur during processing of microelectronics due to thermal strain property mismatches between substrates and applied materials of the microelectronics. Such curvatures, however, may produce relatively small deflections across an entire semiconductor wafer, from which a plurality of image sensor chips may be made, for example. Such curvatures may be insufficient for producing curved image sensor chips. Volumetric swelling may provide orders of magnitude greater local strain gradients on an image sensor chip as compared to local strain gradients provided by thermal strains. Volumetric swelling may be achieved at modest temperatures and pressures, reducing the potential for thermal stresses in an image sensor chip, which may lead to undesired distortions. Such modest temperatures and pressures may also reduce the likelihood for sensor electronics and added functional layers to be damaged during processing. In some examples, temperature and/or pressure may be controlled to control a rate or amount of swelling of the substrate.

A process of bending an image sensor chip by volumetric swelling may involve an image sensor chip, an interface/adhesion layer, a substrate that undergoes swelling, a swellant, and various fixtures or vessels for achieving environmental conditions (e.g., temperature, pressure, electrochemical potential) that lead to substrate swelling. The term "swellant" is used to describe a material (chemical, gas, element, compound, mixture, and so on) that reacts with or is absorbed by a substrate to cause the substrate to undergo volumetric swelling. In some implementations, a swellant may be used for intercalation, which is an inclusion or insertion of a swellant (e.g., molecule or ion) into a solid compound (e.g. a volume-changing substrate).

In various example embodiments, the combination of a curved image sensor chip bonded to a volume-changing substrate may comprise a stand-alone optical device that may be subsequently incorporated into optical systems. For example, a manufacturer may fabricate an optical device comprising the combination of a curved image sensor chip bonded to a volume-changing substrate. The manufacturer may supply such an optical device to another manufacturer that produces optical systems. The optical device may be incorporated into such optical systems.

In various example embodiments, the combination of a planer image sensor chip bonded to a volume-changing substrate may comprise a stand-alone optical device that may be provided to a manufacturer that bends or shapes the planer image sensor chip by subjecting the volume-changing substrate to chemical or physical processes. The manufacturer may incorporate the optical device into a lens system or other optical system or may subsequently provide the resulting curved image sensor chip to another manufacturer that may fabricate an optical system including the curved image sensor chip.

Various example embodiments are described further with reference to FIGS. 1-11.

Example Environment

FIG. 1 is a top view of an image sensor chip 100, according to various example embodiments. Image sensor chip 100 includes a semiconductor substrate 102 upon which a light-sensitive portion 104 is built. Light-sensitive portion 104, which may be a CCD array, for example, includes one or more light-sensitive elements 106. Each such light-sensitive element 106, for example, may correspond to a pixel of an image produced, in part, by light-sensitive portion 104. Light-sensitive portion 104 may be referred to as an "active region", which is capable of converting light energy to electrical energy or electrical signals. Unless otherwise noted, the term "light" refers to electromagnetic energy in any portion of the spectrum. Thus, for example, light or light energy encompasses visible, infrared (IR), near-infrared (NIR), and ultraviolet (UV) portions of the electromagnetic spectrum.

An inactive region 108 may at least partially surround light-sensitive portion 104. Inactive region 108, which may be void of light-sensitive elements, may include various circuit elements, conductive traces, and so on for operating light-sensitive portion 104. For example, if light-sensitive portion 104 is a CCD array, inactive region 108 may include circuitry for controlling rows and columns of the CCD elements. Each of light-sensitive portion 104 and inactive region 108 may occupy any portion of the area of image sensor chip 100. Light-sensitive portion 104 may, for example, be square or rectangular having any aspect ratio (e.g., width-to-height).

Semiconductor substrate 102 may comprise any number of elements, including combinations of such elements, any of which may include added impurities (e.g., dopants). For example, semiconductor substrate 102 may be silicon or germanium. In some examples, thickness of image sensor chip 100 may range from about 5 to 10 microns up to about a millimeter. Width or length of image sensor chip 100 may be in a range from about 5 millimeters up to about 25 millimeters.

Image sensor chip 100 may be incorporated into an optical system that provides light in a particular fashion to image sensor chip 100. For example, in some implementations, a lens system may be configured to have a focal plane that coincides with the location of image sensor chip 100. In a particular implementation, a lens system may be configured to have a focal surface that coincides with the curved surface of a curved version of image sensor chip 100. In other implementations, a lens system may be configured to have a focal length that coincides with the focal length of image sensor chip 100. Optical elements (e.g., lenses and/or mirrors) of the optical system may at least partially determine the location of a focal plane and a focal length. In particular, a portion of an optical system that provides light to light-sensitive portion 104 may be designed based, at least in part, on particular details of light-sensitive portion 104, such as the size of light-sensitive portion 104, the resolution of light-sensitive portion 104, and the positioning of light-sensitive portion 104 with respect to the remainder of the optical system. Performance of optical systems hinges on the design of each of the optical elements of the optical system as well as the overall design of the optical system, which sets forth the optical interaction among the optical elements. For example, light output of one lens may be the light input of a subsequent lens. Generally, quality of the optical elements and their arrangement with respect to one another increases as resolution (e.g., density of light-sensitive elements 106, such as CCD elements that correspond to pixels) increases. For example, such quality may be based, at least in part, on parameters of the individual optical elements, including, but not limited to, structural and optical aberrations, optical transmission or reflection, light uniformity, positioning, and so on.

Figure 2:
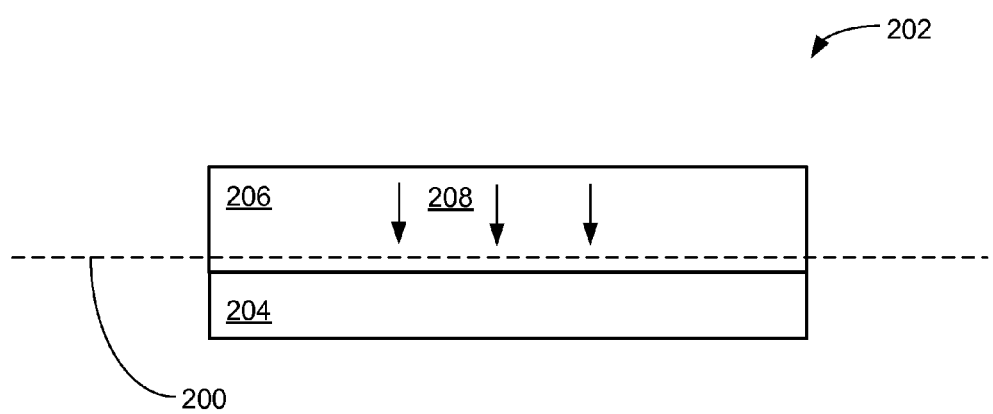
FIG. 2 is a side view illustrating a neutral axis, an image sensor chip, and a volume-changing substrate, according to various example embodiments.

FIG. 2 is a side view illustrating a neutral axis 200 of a configuration 202 that includes an image sensor chip 204 and a volume-changing substrate 206, according to various example embodiments. Forces 208 are imparted to image sensor chip 204 as volume-changing substrate 206 swells in response to a chemical or a physical reaction. The neutral axis is a virtual surface that separates material that is in tension from material that is in compression. For example, in response to forces 208, volume-changing substrate 206 may be in compression above neutral axis 200 and in tension below neutral axis 200. Image sensor chip 204 may be located below neutral axis 200 so it is in tension. In other examples, the substrate swelling process may create a local bending moment onto image sensor chip 204 that is compressive. Thus, purely bending stresses may be solely compressive. However, a mechanical assembly involved with substrate swelling may be biased into net tension if sufficient volumetric swelling is created and another force is used to prevent the bending reaction. Such other force may be a surface pressure or mechanical constraint, such as a mold. The location of neutral axis 200 with respect to the location of image sensor chip 204 may affect the amount of bending of image sensor chip 204. The location and "shape" of neutral axis 200 may depend, at least in part, on a number of factors, such as placement, thickness, and/or shape of volume-changing substrate 206, as well as stiffness and thickness of image sensor chip 204. Thus, a fabricator may at least partially control where to locate neutral axis 200 based on these factors. For example, increasing stiffness of volume-changing substrate 206 may place a neutral axis increasingly toward (and possible into) image sensor chip 204. Stiffness of volume-changing substrate 206 may depend, at least in part, on thickness and material of volume-changing substrate 206

Figure 3:
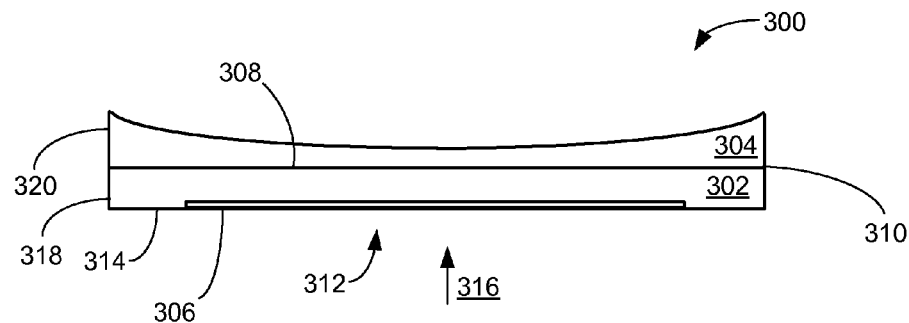
FIG. 3 is a side view of an image sensor chip and a volume-changing substrate, according to various example embodiments.
Figure 4:
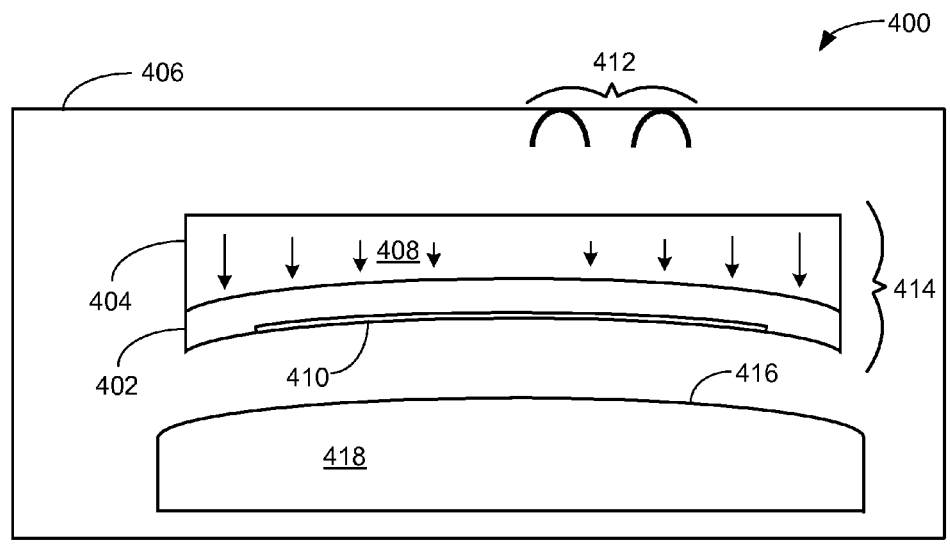
FIG. 4 is a side view of an image sensor chip and a volume-changing substrate in a reaction vessel, according to various example embodiments.
Figure 5:
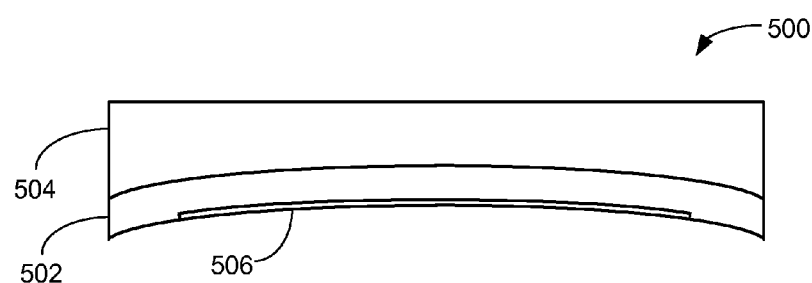
FIG. 5 is a side view of a curved image sensor chip and a volume-changing substrate, according to various example embodiments.

FIGS. 3-5 illustrate various portions of an example process of bending or shaping an image sensor chip, such as image sensor chip 100, according to some example embodiments. Such a process may be performed by any entity, either manually (e.g., by human), automatically (e.g., by machine), or a combination thereof. Such an entity, which may, for example, be a manufacturer, assembler, fabricator, or builder is herein referred to as a "fabricator". Such a process may comprise batch processing, wherein a plurality (e.g., dozens, hundreds, or thousands) of image sensor chips may be shaped simultaneously.

FIG. 3 is a side view of a configuration 300 that includes an image sensor chip 302 and a volume-changing substrate 304, according to various example embodiments. Image sensor chip 302 includes a light-sensitive portion 306, which may be the same as or similar to light-sensitive portion 104 illustrated in FIG. 1, for example. In some implementations, volume-changing substrate 304 is bonded, laminated, or otherwise coupled to a first surface 308 of image sensor chip 302. A fabricator may use an interface layer 310, which may have adhesive properties, to perform such coupling. In some implementations, however, an adhesive interface layer need not be used. In that case, volume-changing substrate 304 may be coupled directly to image sensor chip 302.

First surface 308 is opposite a second surface 312 that includes light-sensitive portion 306, which is the light-sensitive portion of image sensor chip 302. Second surface 312 may also include an inactive region 314, which may be the same as or similar to inactive region 108 illustrated in FIG. 1, for example. Arrow 316 indicates a direction of incident light which image sensor chip 302 is configured to receive.

An edge 318 of image sensor chip 302 may or may not align with an edge 320 of volume-changing substrate 304. In some implementations, volume-changing substrate 304 may extend beyond edge 318 of image sensor chip 302. In other implementations, image sensor chip 302 may extend beyond edge 320 of volume-changing substrate 304.

During swelling, volume-changing substrate 304 may generate forces that give rise to stresses and strains on image sensor chip 302. Contributions of bending strains to the overall strain state of a relatively thin image sensor chip 302 may be less compared to a thicker image sensor chip. Generally, a combination of bending strains and stretch strains may bend or shape image sensor chip 302. A fabricator may select a thickness for image sensor chip 302 so that the image sensor chip is mechanically strong, allowing enough strain for bending to be applied without generating cracks or buckling. In some particular implementations, image sensor chip 302 may comprise CMOS sensors fabricated with silicon-on-insulator (SOI) wafers having a device layer thickness in the range of about 3 to about 10 microns.

Volume-changing substrate 304 may comprise any number of materials that swell as a result of a chemical or physical reaction. Such materials may include a metallic alloy, aluminum, titanium, a polymer, or an elastomer, just to name a few examples. Chemical or physical reactions may involve exposing volume-changing substrate 304 to any of a number of particular chemicals or elements and/or applying electrical current to volume-changing substrate 304, for example.

In some implementations, initial (e.g., prior to volumetric swelling) thickness of volume-changing substrate 304 may be substantially constant across image sensor chip 302. In other implementations, as illustrated in FIG. 3, initial thickness of volume-changing substrate 304 may vary across image sensor chip 302. In some examples, thickness of volume-changing substrate 304 may be in a range from about the thickness of image sensor chip 302 up to more than about 25 microns thicker than the sensor chip. In other examples, thickness of volume-changing substrate 304 may be at least several times greater than a thickness of image sensor chip 302. For a particular example, image sensor chip 302 may be about 5 to 10 microns thick and volume-changing substrate 304 may be about 25 to 100 microns thick. In other examples, thickness of image sensor chip 302 may be greater than 10 microns, and volume-changing substrate 304 may be at least several times thicker than image sensor chip 302.

In some example embodiments, a fabricator may control local curvature of image sensor chip 302 by tailoring the layer thickness of volume-changing substrate 304. For example, such layer thickness may be determined by finite element simulations or experiments. Accordingly, the shape of image sensor chip 302 may be controlled to achieve desired curve magnitude (e.g., local radii of curvature) and overall shape (e.g., parabolic or spherical).

Interface layer 310 may adhere volume-changing substrate 304 to image sensor chip 302 and may also at least partially buffer volumetric strains in volume-changing substrate 304 from image sensor chip 302 to prevent large interfacial stresses from occurring. For example, without such buffering, volumetric strains may increase across the interface of volume-changing substrate 304 to image sensor chip 302, leading to possible failure of the image sensor chip by spalling or cracking Buffering may be particularly beneficial since volume-changing substrate 304 may undergo significant swelling (strain) and image sensor chip 302 may not experience any strain. Therefore, at a boundary between the swelled substrate and the sensor, a strain mismatch may occur that results in localized stresses that may act to de-bond or fracture image sensor chip 302. Interface layer 310 may have adhesion properties and elastic properties that are sufficient to transfer stress into image sensor chip 302 while preventing relatively high local stresses. In some implementations, interface layer 310 may comprise thermoset adhesives such as, for example, epoxy or polyurethane. In other implementations, interface layer 310 may comprise thermoplastics such as polyether ether ketone (PEEK) or polysulfone polymers. Such materials, or other interface layer materials, may have appropriate combinations stiffness, mechanical strength, and adhesion to maintain integrity and/or adhesion while being subjected to stresses. In some cases, a fabricator may apply a surface treatment to first surface 308 of image sensor chip 302 and/or to volume-changing substrate 304 to achieve sufficient adhesive strength between image sensor chip 302 and volume-changing substrate 304. Such a surface treatment may include, for example, a plasma treatment, acid or base washes, and/or interface surface treatments such as, for example, a silane adhesion promoter.

In some example embodiments, a fabricator may place volume-changing substrate 304 onto image sensor chip 302 by a deposition process. The fabricator may use any number of deposition techniques such as, for example, spin coating, vapor deposition, sputtering, and so on. In some implementations, the fabricator may place (e.g., by deposition, lamination, or gluing) interface layer 310 onto image sensor chip 302 before depositing material for volume-changing substrate 304 onto the interface layer. In other implementations, an interface layer need not be included in configuration 300 so that volume-changing substrate 304 is in direct contact with image sensor chip 302. In that case, volume-changing substrate 304 may be deposited directly onto image sensor chip 302.

A fabricator may select a material for volume-changing substrate 304 based, at least in part, on chemical composition and chemical reaction type of the material. For example, one class of materials may undergo hydrogen-based swelling reactions. Many metals can absorb hydrogen under particular pressure and temperature conditions. Candidate materials for hydrogen swelling include, for example, titanium, vanadium, palladium, alloys thereof, and $LaNi_5$-based alloys. Such materials volumetrically swell by accepting substantial amounts of hydrogen. For example, depending, at least in part, on the material and hydrogen-insertion conditions (e.g., pressure and/or temperature at which materials are exposed to hydrogen gas), volume-changing substrate 304 may volumetrically swell by about 1% to 30% of the original volume of the material.

In some particular examples, a fabricator may expose a titanium foil bonded to image sensor chip 302 to hydrogen gas. A resulting hydrogenation reaction may be expressed as $Ti+H_2 \rightarrow TiH_2$. Titanium (or other metals) may undergo such a reaction, which may be exothermic, at room temperature and atmospheric pressure (of hydrogen gas). Elevated temperatures and/or pressures, however, may accelerate the reaction. In any case, such a reaction may occur in a time span ranging from about a few minutes up to about several hours or more, depending, at least in part on temperature, pressure, concentration of swellant, surface conditions of volume-changing material 304, and so on.

In some implementations, a fabricator may pre-treat volume-changing material 304 so that the surface of volume-changing material 304 that will be exposed to a swellant (e.g., hydrogen gas) is in a relatively good condition for undergoing a hydrogenation reaction. For a particular example, an activation process may involve baking volume-changing material 304 at temperatures around 200 degrees centigrade in a vacuum to remove surface oxidation on volume-changing material 304.

In some implementations, a fabricator need not allow a complete hydrogenation reaction. For example, the fabricator may perform a partial hydrogenation reaction as a technique to control the amount of swelling of volume-changing material 304. For some particular examples, a substantially complete hydrogenation reaction may lead to volumetric swelling of volume-changing material 304 by about 30%. On the other hand, a partial hydrogenation reaction may be used to achieve volumetric swelling of volume-changing material 304 by any amount between 0% and 30%.

Volume-changing substrate 304 may comprise a class of materials able to undergo volumetric swelling by oxygenation reactions. For example, material such as aluminum and titanium can be oxidized by applying an electrochemical potential to the material, resulting in volumetric swelling. For aluminum alloys, such oxidizing is similar to or the same as an anodizing process. The amount of swelling may be at least partially controllable by controlling electrical voltage and/or current applied to the oxidizing material.

Volume-changing substrate 304 may comprise yet another class of materials able to undergo volumetric swelling by chemically reacting with lithium. Such a chemical reaction with lithium may be called "lithiation". Candidate materials for lithiation include silicon, germanium, tin, indium, metal oxides (e.g., vanadium oxide), and metal phosphates (e.g., iron phosphate). Lithiation may be performed using, for example, butyl lithium or metallic lithium. In some implementations, a fabricator may at least partially control the amount of swelling by adjusting the quantity and/or concentration of a lithium reactant. In other implementations, the fabricator may at least partially control the amount of swelling by adjusting the electrochemical potential during lithiation. For example, depending, at least in part, on the material and lithiation conditions, volume-changing substrate 304 may volumetrically swell by about 1% to 300% of the original volume of the material.

Volume-changing substrate 304 may comprise still another class of materials able to undergo volumetric swelling by hydration or solvation. Candidate materials for hydration or solvation include some polymers and elastomers such as, for example, butyl rubber. These and any other classes of volume-changing materials may be used for the substrate.

FIG. 4 is a side view of a system 400 including a curved image sensor chip 402, a volume-changing substrate 404, and a reaction vessel 406, according to various example embodiments. For example, curved image sensor chip 402 may be the same as or similar to flat image sensor chip 302, illustrated in FIG. 3, subsequent to volumetric swelling of volume-changing substrate 404, which may be volumetrically swelled from volume-changing substrate 304. For example, volume-changing substrate 304 has a first thickness profile and volume-changing substrate 404 has a second thickness profile that is different from the first thickness profile. Reaction vessel 406 may be large enough to accommodate a plurality of curved image sensor chips 402 for batch processing, where the image sensor chips may be shaped simultaneously.

Volumetric swelling of volume-changing substrate 404 may generate forces 408 that act non-homogeneously across the area of image sensor chip 402. Accordingly, forces 408 lead to bending stresses that may deform image sensor chip 402 into a desired spherical, aspheric, or other shape. In particular, a light-sensitive region 410 may deform as the remaining portions of image sensor chip 402 deform.

The shape and amount of curvature induced by volumetric swelling of volume-changing substrate 404 may be at least partially controlled by a number of factors. For example, the amount of insertion of a swellant into volume-changing substrate 404 may affect the amount of volumetric swelling. Amount of such insertion may depend, at least in part, on a number of process parameters such as, for example, temperature, pressure, and voltage involved in the process. For another example, the thickness profile of volume-changing substrate 404 (or volume-changing substrate 304) may affect the amount of volumetric swelling of volume-changing substrate 404, and will be discussed below. In yet another example, masks and/or electrode patterns may affect the amount of volumetric swelling of volume-changing substrate 404. Masking particular areas of volume-changing substrate 404 may prevent or reduce absorption of swellants, thus eliminating or reducing local swelling of volume-changing substrate 404 and reducing curvature of image sensor chip 402. Similarly, by locating electrodes in particular areas of volume-changing substrate 404, electrochemically-driven swelling reactions may be confined to desired local areas of volume-changing substrate 404. The shape and amount of curvature induced by volumetric swelling of volume-changing substrate 404 may also be at least partially controlled by limiting deposition of the material of volume-changing substrate 404 to particular areas of image sensor chip 402.

Reaction vessel 406 need not be used for some chemical or physical reactions that lead to volumetric swelling. For other chemical or physical reactions, however, reaction vessel 406 may contain one or more swellants at various pressures and/or temperatures. For example, reaction vessel 406 may include pumps or pressurized gas containers with valves (not shown) to provide controlled pressure inside reaction vessel 406. In another example, reaction vessel may include heating elements (not shown) to control temperature inside reaction vessel 406. In some implementations, reaction vessel 406 may include sensors 412 to monitor the rate of swelling and/or sensor curvature. Such sensors may comprise cameras focused on one or more image sensing chips 402 undergoing bending induced by volumetric swelling of volume-changing substrate 404. In another example, cameras may be focused on volume-changing substrate 404. A human operator may monitor volume of volume-changing substrate 404 and/or curvature of image sensor chip 402 by observing images produced by such cameras. Machine vision may instead be used to analyze digital images of such cameras to automatically monitor volume of volume-changing substrate 404 and/or curvature of image sensor chip 402. In yet another example, sensors 412 may comprise a strain gauge placed on a particular volume-changing substrate and/or a particular image sensor chip. Such a particular volume-changing substrate and/or a particular image sensor chip having an attached strain gauge (which may render the image sensor chip unusable) may be a sacrificial sample among a plurality of image sensor chips 402 in a batch process, for example. A method to measure deflection and/or curvature of image sensor chip 402 and/or volume-changing substrate 404 may be used to limit the shaping process to a desired amount of swelling. For example, a number of intercalation and swelling reactions may be controlled by a process variable to stop swelling on-demand (e.g., such as lowering temperature, pressure, or voltage in reaction vessel 406.)

In some implementations involving hydrogen reactions, reaction vessel 406 may include a regulator (not shown) to control pressure levels of hydrogen gas. A fabricator may increase temperature of the hydrogen gas at constant pressure inside reaction vessel 406. Under such conditions, hydrogen may migrate into volume-changing substrate 404, leading to a swelling reaction and inducing curvature of image sensing device 402.

In some implementations involving chemical reactions, the rate and amount of insertion of swellant into volume-changing substrate 404 (which at least partially determines the amount of volumetric swelling) may be controlled by the rate and concentration of the swellant (e.g. butyl lithium) to which volume-changing substrate 404 is exposed.

In some implementations involving electrochemical processes, reaction vessel may include an electrolyte (either solid or liquid) and a pair of electrodes in contact with volume-changing substrate 404 and a source of swellant, such as, for example, an intercalant (e.g., Li ions in solution). The environment inside reaction vessel 406 may be controlled to help prevent a reaction between Li and water or oxygen. In addition, reaction vessel may include an electrical source (e.g., voltage source or current source) that can supply precise amounts of voltage or current to control insertion of ions into volume-changing substrate 404.

In some example embodiments, before, during, or subsequent to volumetric swelling of volume-changing substrate 404, a fabricator may apply one or more forces to a configuration 414 that includes curved image sensor chip 402 and volume-changing substrate 404 to force the shape of curved image sensor chip 402 to take on the shape of shaped surface 416 of a forming mold 418. In other words, a fabricator may squeeze configuration 414 and forming mold 418 together so that curved image sensor chip 402 deforms to the shape of shaped surface 416. Forming mold 418 may help deformation due to volumetric swelling of volume-changing substrate 404 to occur uniformly. Generally, at relatively large levels of induced curvature, instability may occur where a thin shell reverts to cylindrical (e.g., one-axis) curvature as opposed to spherical type curvature. To help prevent such instability, forming mold 418 comprising a positive-shape surface may be placed in close proximity to light-sensitive region 410.

FIG. 5 is a side view of a sensor module 500 including a shaped image sensor chip 502 and a volume-changing substrate 504, according to various example embodiments. Sensor module 500 may the same as or similar to configuration 414 illustrated in FIG. 4. Shaped image sensor chip 502 may be spherical, parabolic, aspheric, or a compound shape having one or more inflection points, just to name a few examples. Shaped image sensor chip 502 includes a light-sensitive portion 506. Sensor module 500 may be a stand-alone optical device that can be incorporated in an optical system, for example. In particular, a fabricator may build sensor module 500 and provide sensor module 500 to an assembler (which may be the same entity as the fabricator). The assembler may use sensor module 500 as an image sensor, which may be incorporated in an optical system.

Figure 6:
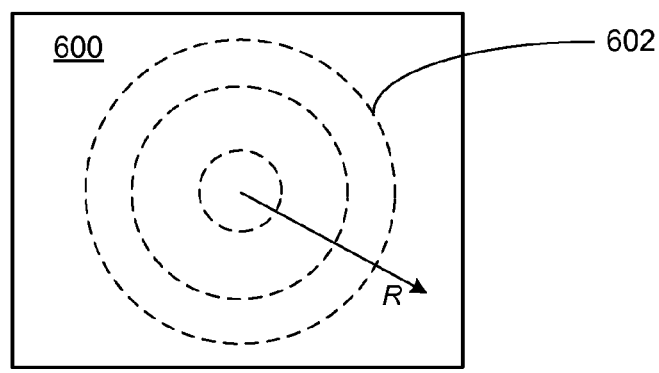
FIG. 6 is a top view of a volume-changing substrate having thickness that varies concentrically about a center region of the volume-changing substrate, according to a number of example embodiments.

FIG. 6 is a top view of a volume-changing substrate 600 having thickness that varies concentrically about a center region of the volume-changing substrate, according to a number of example embodiments. Thickness of volume-changing substrate 600 may be varied in a particular fashion to affect the shape of bending of an image sensor chip (not shown in FIG. 6) that is attached (e.g., bonded or glued) to volume-changing substrate 600. Iso-lines 602 indicate lines of constant thickness. Spacing between adjacent iso-lines 602 may vary, indicating changing thickness. For example, iso-lines 602 spaced relatively close to one another indicate that thickness changes in a radial direction (indicated by R) quickly over a relatively short distance. Concentric iso-lines 602 indicate that thickness of volume-changing substrate 600 varies symmetrically in a radial direction. Accordingly, a fabricator may use volume-changing substrate 600 having a thickness that varies in such a way for forming an image sensor chip into a spherical shape (e.g., concentric iso-lines having equal spacing), an aspheric or parabolic shape (e.g., concentric iso-lines having unequal spacing), or a more complex shape (e.g., nonconcentric iso-lines having unequal spacing).

Figure 7:
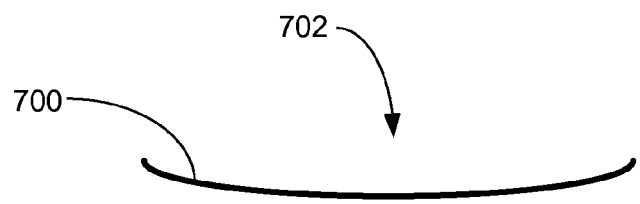
FIGS. 7 and 8 are cross-section views of the light-sensitive surface of curved image sensor chips, according to various example embodiments.
Figure 8:
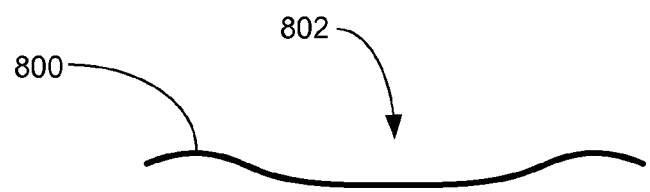

FIGS. 7 and 8 are cross-section views illustrating shapes of light-sensitive portions of curved image sensor chips, according to various example embodiments. In FIG. 7, a light-sensitive portion 700 of a curved image sensor chip 702 has a spherical or aspheric shape. Such a shape has no inflection points. Light-sensitive portion 700 is concave. On the other hand, as illustrated in FIG. 8, a light-sensitive portion 800 of a curved image sensor chip 802 has a complex shape that includes one or more inflection points. Portions of light-sensitive portion 800 may include spherical or aspheric shapes. Such complex shapes may be useful in a number of optical systems. Volume-changing substrates, such as those described above, may be designed, in combination with applied forces and/or torques, to produce complex shapes of light-sensitive portion 800.

Figure 9:
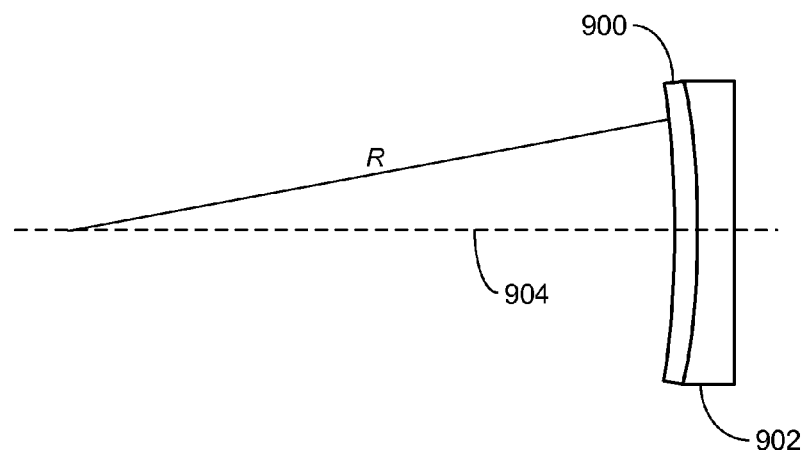
FIG. 9 is a cross-section view of a curved image sensor chip and a volume-changing substrate, according to various example embodiments.

FIG. 9 is a cross-section view that illustrates curvature of a curved image sensor chip 900, which is attached to a volume-changing substrate 902, according to various example embodiments. The combination of a curved image sensor chip bonded to a volume-changing substrate may comprise a stand-alone optical device that may be subsequently incorporated into optical systems. An optical axis 904 of such optical systems is shown in relation to image sensor chip 900. Dimensions and volume of a volume-changing substrate may remain constant (e.g., dozens of years or more) under environmental conditions that are typical (e.g., room temperature, atmospheric pressure) for optical systems or in an absence of swellants. For example, a hydrogenation reaction that leads to volumetric swelling of volume-changing substrate 902 may be exothermic. Accordingly, the volumetrically swelled substrate may be relatively chemically and physically stable.

A focal length of image sensor chip 900, which is based, at least in part, on the curved shape of image sensor chip 900, may be a significant factor when image sensor chip 900 is incorporated in an optical system. When the shape of image sensor chip 900 is substantially spherical, the focal length of image sensor chip 900 may be at least approximately equal to the inverse of the radius of curvature R of image sensor chip 900. If image sensor chip 900 has an aspheric shape, then the radius of curvature of image sensor chip 900 changes with distance from optical axis 904. An optical system that incorporates image sensor chip 900 may be designed to accommodate such a variable radius of curvature.

Figure 10:
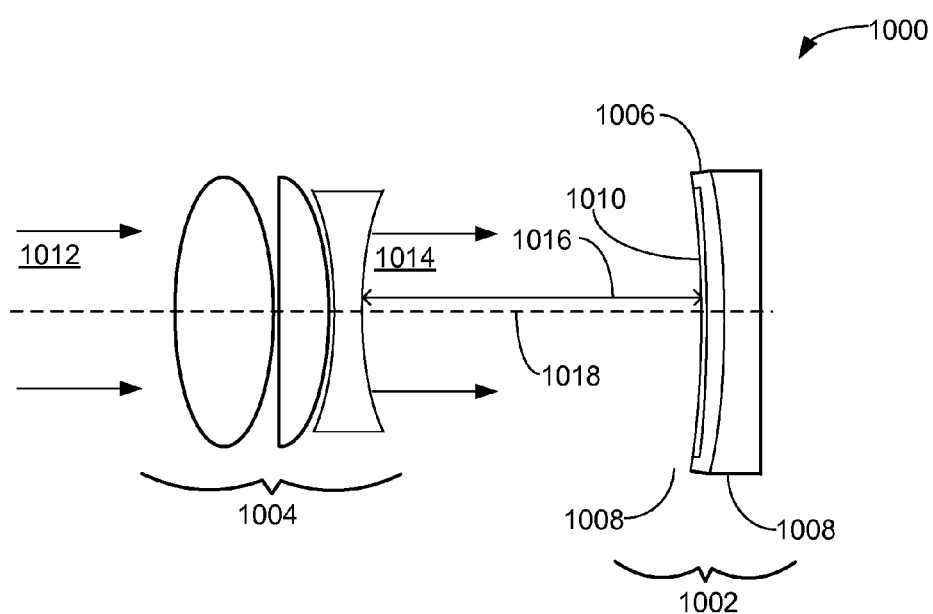
FIG. 10 is a cross-section view of an optical system that includes a curved image sensor chip and a volume-changing substrate, according to various example embodiments.

FIG. 10 is a cross-section view of an optical system 1000 that includes an image sensor module 1002 and a lens assembly 1004, according to various example embodiments. In particular, image sensor module 1002 comprises a curved image sensor chip 1006 and a volume-changing substrate 1008. Curved image sensor chip 1006 includes a light-sensitive portion 1010. Curved image sensor chip 1006 and volume-changing substrate 1008 may be similar to or the same as curved image sensor chip 302 and volume-changing substrates 304 illustrated in FIG. 3, respectively. In some implementations, volume-changing substrate 1008 may be sufficiently rigid to maintain the curved shape of curved image sensor chip 1006.

Curved image sensor chip 1006 (or light-sensitive portion 1010) may have a shape that gives rise to a focal length. Such a focal length may be considered when placing image sensor module 1002 in optical system 1000. In particular, lens assembly 1004 may be designed to receive light 1012, optically operate on the light, and produce light output 1014 that focuses an image onto curved image sensor chip 1006, which may be a distance 1016 from lens assembly 1004. Distance 1016 may be at least approximately equal to a focal length of curved image sensor chip 1006. In some implementations, an inverse of the focal length of curved image sensor chip 1006 is at least approximately equal to the radius of curvature of curved image sensor chip 1006. Lens assembly 1004 and image sensor module 1002 may be aligned along an optical axis 1018.

Figure 11:
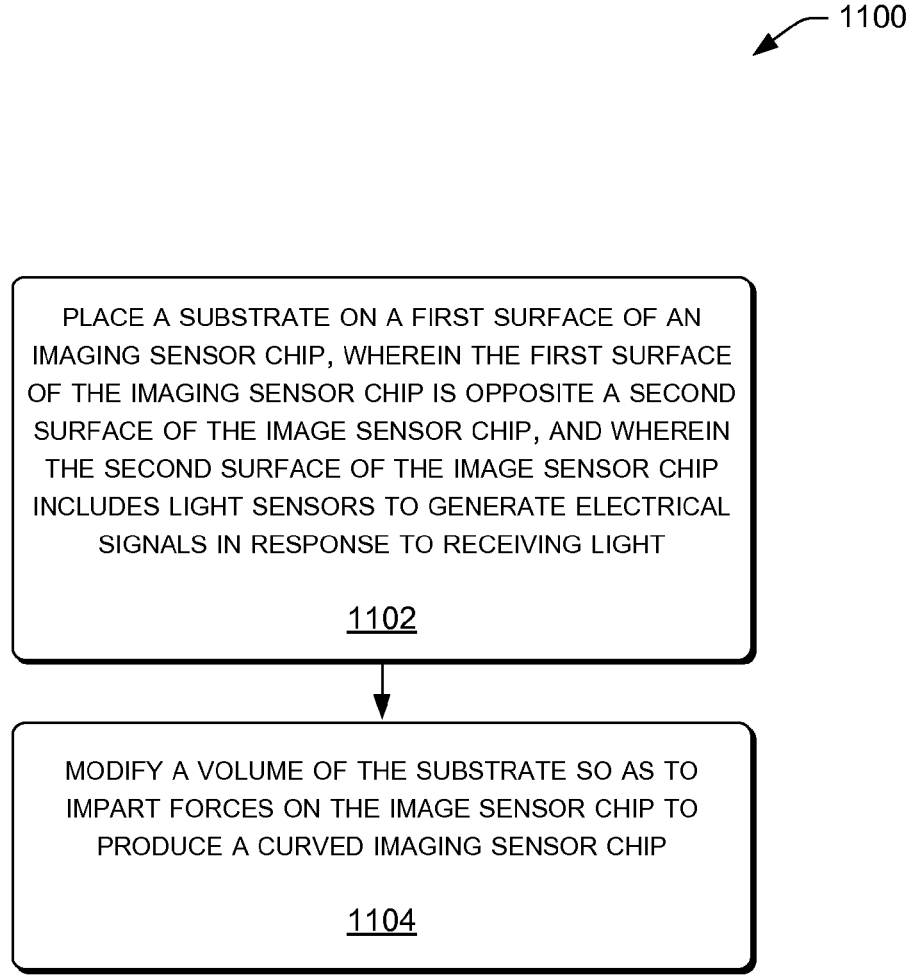
FIG. 11 is a flow diagram illustrating processes for bending an image sensor chip, according to some example embodiments.

FIG. 11 is a flow diagram illustrating a process 1100 for bending an image sensor chip, according to some example embodiments. For example, such an image sensor chip may be the same as or similar to image sensor chip 302 shown in FIG. 3. Process 1100 may be similar to or the same as process depicted in FIGS. 3-5 and may be performed by a fabricator. At block 1102, a fabricator may place a substrate on a first surface of an image sensor chip, wherein the first surface of the image sensor chip is opposite a second surface of the image sensor chip, and wherein the second surface of the image sensor chip includes light sensors to generate electrical signals in response to receiving light. At block 1104, the fabricator may modify a volume of the substrate so as to impart forces on the image sensor chip to produce a curved image sensor chip.

Example Clauses

A. A method comprising: placing a substrate on a first surface of an image sensor chip, wherein the first surface of the image sensor chip is opposite a second surface of the image sensor chip, and wherein the second surface of the image sensor chip includes light sensors to generate electrical signals in response to receiving light; and modifying a volume of the substrate so as to impart forces on the image sensor chip to produce a curved image sensor chip.

B. The method as paragraph A recites, wherein the second surface of the curved image sensor chip has a concave spherical or aspheric shape.

C. The method as any one of paragraphs A-B recites, wherein placing the substrate on the first surface of the image sensor chip comprises: coupling the first surface of the image sensor chip to the substrate using an interface layer.

D. The method as any one of paragraphs A-C recites, wherein the substrate comprises a metallic alloy, and wherein modifying the volume of the substrate comprises: exposing the substrate to hydrogen to allow the substrate to absorb the hydrogen.

E. The method as any one of paragraphs A-C recites, wherein the substrate comprises a metallic alloy, and wherein modifying the volume of the substrate comprises: applying an electrical current to at least a portion of the substrate to perform an oxygenation reaction.

F. The method as any one of paragraphs A-D recites, wherein the metallic alloy includes aluminum or titanium.

G. The method as any one of paragraphs A-C recites, wherein modifying the volume of the substrate comprises: exposing the substrate to a lithium-based chemical in a lithiation process.

H. The method as any one of paragraphs A-C recites, wherein the substrate comprises a polymer or an elastomer, and wherein modifying the volume of the substrate comprises: exposing the substrate to one or more chemicals in a hydration process or a solvation process.

I. The method as any one of paragraphs A-C recites, wherein modifying the volume of the substrate comprises: applying a controlled temperature, pressure, or voltage to particular portions of the substrate.

J. The method as any one of paragraphs A-C recites, wherein, prior to modifying the volume of the substrate, the substrate has a first thickness profile, and wherein subsequent to modifying the volume of the substrate, the substrate has a second thickness profile that is different from the first thickness profile.

K. The method as any one of paragraphs A-C recites, further comprising: placing a forming mold adjacent to the second surface of the image sensor.

L. An apparatus comprising: a curved image sensor chip having a first side and a second side opposite the first side, wherein the second side includes light sensors to generate electrical signals in response to receiving light; and a substrate covering the first side of the curved image sensor chip, wherein the substrate comprises a hydrogenated metal.

M. The apparatus as paragraph L recites, wherein the second side of the curved image sensor chip has a concave spherical or aspheric shape.

N. The apparatus as any one of paragraphs L-M recites, wherein the hydrogenated metal comprises titanium hydride or vanadium hydride.

O. The apparatus as any one of paragraphs L-N recites, further comprising an interface layer that couples the substrate to the first side of the curved image sensor chip.

P. The apparatus as any one of paragraphs L-O recites, wherein the curved image sensor chip has a radius of curvature that is at least approximately equal to an inverse focal length of the second side of the curved image sensor chip.

Q. A system comprising: one or more lenses or mirrors; a curved image sensor chip having a first side and a second side opposite the first side, wherein the second side includes light sensors to generate electrical signals in response to receiving light from the one or more lenses or mirrors; and a substrate covering the first side of the curved image sensor chip, wherein the substrate comprises a hydrogenated metal.

R. The system as paragraph Q recites, wherein the substrate includes masked areas that at least partially prevent absorption by the substrate of one or more swelling chemicals.

S. The system as any one of paragraphs Q-R recites, wherein the curved image sensor chip has a radius of curvature that is at least approximately equal to an inverse focal length of the second side of the curved image sensor chip.

T. The system as any one of paragraphs Q-S recites, wherein the image sensor chip comprises silicon or germanium.

CONCLUSION

Although the subject matter has been described in language specific to structural features and/or methodological acts, it is to be understood that the subject matter defined in the appended claims is not necessarily limited to the specific features or acts described. Rather, the specific features and steps are disclosed as example forms of implementing the claims.

All of the methods and processes described above may be embodied in, and fully automated via, software code modules executed by one or more general purpose computers or processors. The code modules may be stored in any type of computer-readable medium, computer storage medium, or other computer storage device. Some or all of the methods may alternatively be embodied in specialized computer hardware such as, for example, a quantum computer or quantum annealer.

Conditional language such as, among others, "can," "could," "may" or "may," unless specifically stated otherwise, are understood within the context to present that certain examples include, while other examples do not include, certain features, elements and/or steps. Thus, such conditional language is not generally intended to imply that certain features, elements and/or steps are in any way required for one or more examples or that one or more examples necessarily include logic for deciding, with or without user input or prompting, whether certain features, elements and/or steps are included or are to be performed in any particular example.

Conjunctive language such as the phrase "at least one of X, Y or Z," unless specifically stated otherwise, is to be understood to present that an item, term, etc. may be either X, Y, or Z, or a combination thereof.

Any routine descriptions, elements or blocks in the flow diagrams described herein and/or depicted in the attached figures should be understood as potentially representing modules, segments, or portions of code that include one or more executable instructions for implementing specific logical functions or elements in the routine. Alternate implementations are included within the scope of the examples described herein in which elements or functions may be deleted, or executed out of order from that shown or discussed, including substantially synchronously or in reverse order, depending on the functionality involved as would be understood by those skilled in the art.

It should be emphasized that many variations and modifications may be made to the above-described examples, the elements of which are to be understood as being among other acceptable examples. All such modifications and variations are intended to be included herein within the scope of this disclosure and protected by the following claims.

What is claimed is:

1. A method comprising:
   placing a substrate on a first surface of an image sensor chip, wherein the first surface of the image sensor chip is opposite a second surface of the image sensor chip, and wherein the second surface of the image sensor chip includes light sensors configured to generate electrical signals in response to receiving light; and
   increasing a volume of the substrate at least until a bending force produced by increasing the volume of the substrate is applied to the image sensor chip such that a curved image sensor chip is produced.

2. The method of claim 1, wherein the second surface of the curved image sensor chip has a concave spherical shape or an aspheric shape.

3. The method of claim 1, wherein placing the substrate on the first surface of the image sensor chip comprises:
   coupling the first surface of the image sensor chip to the substrate using an interface layer.

4. The method of claim 1, wherein the substrate comprises a metallic alloy, and wherein increasing the volume of the substrate comprises:
   exposing the substrate to hydrogen to allow the substrate to absorb the hydrogen.

5. The method of claim 1, wherein the substrate comprises a metallic alloy, and wherein increasing the volume of the substrate comprises:
   applying an electrical current to at least a portion of the substrate to perform an oxygenation reaction.

6. The method of claim 5, wherein the metallic alloy includes aluminum or titanium.

7. The method of claim 1, wherein increasing the volume of the substrate comprises:
   exposing the substrate to a lithium-based chemical in a lithiation process.

8. The method of claim 1, wherein the substrate comprises a polymer or an elastomer, and wherein increasing the volume of the substrate comprises:
   exposing the substrate to one or more chemicals in a hydration process or a solvation process.

9. The method of claim 1, wherein increasing the volume of the substrate comprises:
   applying a controlled temperature, pressure, or voltage to particular portions of the substrate.

10. The method of claim 1, wherein, prior to increasing the volume of the substrate, the substrate has a first thickness profile, and wherein subsequent to increasing the volume of the substrate, the substrate has a second thickness profile that is different from the first thickness profile.

11. The method of claim 1, further comprising:
    placing a forming mold adjacent to the second surface of the image sensor.

12. The method of claim 1, wherein the increasing the volume of the substrate comprises swelling the substrate.

13. The method of claim 1, further comprising:
    introducing a swellant to the substrate, the swellant configured to be absorbed into at least a portion of the substrate.

14. The method of claim 1, wherein the increasing the volume comprises intercalation of a swellant into at least a portion of the substrate.

* * * * *